(12) United States Patent
Vityaev et al.

(10) Patent No.: US 6,473,010 B1
(45) Date of Patent: Oct. 29, 2002

(54) METHOD AND APPARATUS FOR DETERMINING ERROR CORRECTION CODE FAILURE RATE FOR ITERATIVE DECODING ALGORITHMS

(75) Inventors: Andrei Vityaev, Santa Clara, CA (US); Zining Wu, Los Altos, CA (US); Greg Burd, San Jose, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/603,188

(22) Filed: Jun. 26, 2000

Related U.S. Application Data

(60) Provisional application No. 60/194,660, filed on Apr. 4, 2000.

(51) Int. Cl.[7] ............................................... H03M 7/00
(52) U.S. Cl. ........................................................ 341/107
(58) Field of Search ........................... 341/107, 51, 58, 341/67, 106

(56) References Cited

U.S. PATENT DOCUMENTS

| | | | | |
|---|---|---|---|---|
| 4,630,032 A | * | 12/1986 | Gordon | 34110/107 |
| 5,475,388 A | * | 12/1995 | Gormish | 341/107 |
| 5,805,006 A | | 9/1998 | Sutardja et al. | 327/336 |

OTHER PUBLICATIONS

Weishi Feng, et al. "On the Performance of Parity Codes in Magnetic Recording Systems", IEEE Globecom 2000, pp 8–11.

T. Conway, "A new target response with parity coding for high density magnetic recording channels," *IEEE Trans. On Magnetics*, vol. 34, No. 4, pp. 2382–2386, Jul. 1998.

H. Sawaguchi and S. Mita, "Soft–output decoding for concatenated error correction in high–order PRML channels," in *Proc. of IEEE International Conference on Communications (ICC)*1999, Vancouver, Jun. 1999.

R. He and N. Nazari, "An analytical approach for performance evaluation of partial response systems in the presence of signal–Dependent medium noise," in *Proc. of Globecom 1999*, Rio de Janeiro, Brazil, Dec. 1999.

Weisihi Feng, Andrei Vityaev, Greg Burd, Nersi Nazari, "On the Performance of Parity Codes in Magnetic Recording Systems, "in *IEEE Globecom*2000.

* cited by examiner

*Primary Examiner*—Brian Young
(74) *Attorney, Agent, or Firm*—Eric B. Janofsky; Katten Muchin Zavis Rosenman

(57) ABSTRACT

A design-based tool for determining an error correction code (ECC) failure probability of an iterative decoding algorithm provides a technique for testing the effectiveness of the algorithm before the integrated circuit implementing the algorithm is built.

20 Claims, 7 Drawing Sheets

METHOD AND APPARATUS FOR DETERMINING ERROR CORRECTION CODE FAILURE RATE FOR ITERATIVE DECODING ALGORITHMS

CROSS-REFERENCE TO RELATED APPLICATIONS

This application claims priority under 35 U.S.C. §119(e) on provisional application serial No. 60/194,660 entitled "A Method for Determining the Error Correction Code Failure Rate for Iterative Decoding Algorithms," filed on Apr. 4, 2000, the contents of which are incorporated herein by reference.

FIELD OF THE INVENTION

The present invention relates to a method and apparatus for determining the Error Correction Code (ECC) failure rate or probability of iterative decoding algorithms. The invention further relates to a program of instructions (e.g., software) for implementing the method.

BACKGROUND OF THE INVENTION

The performance of digital communication and storage systems can be significantly improved by the use of error correction coding. As a result, most, if not all, such systems use some form of error correction coding, which generally involves systematically adding redundant bits to each block of data as insurance against read/write errors. A given ECC can recover the original data from a contaminated block if the number of erroneous bits is less than the maximum number allowed by that particular code.

In the magnetic recording industry, different error correction coding and detection schemes are compared against each other by considering both the bit error rate (BER) versus signal-to-noise (SNR) curves and the ECC failure probability. The BER provides useful information as to the frequency of errors. However, since the data is encoded using an ECC, the true goal is to minimize the ECC failure probability rather than the BER itself. Therefore, one needs to compare not only the frequency of errors (which is reflected by the BER) but also the types and magnitudes of errors that occur. If scheme A has fewer errors overall than scheme B, but the probability of a large error burst is higher for A than for B, then the ECC failure rate may be higher for A than for B.

For systems in which an output BER below $10^{-10}$ is desirable, ECCs, such as Reed-Solomon (RS) codes, are usually concatenated with convolutional codes. In recent years, convolutional codes have been replaced by iterative codes to deliver the required BER. Since an iterative decoding algorithm is required to decode such iterative codes, the failure probability of the ECC is based on the error characteristics of the decoding algorithm. While iterative codes such as turbo codes and low-density parity-check (LDPC) codes have shown very good performance for communication systems at output BERs of $10^{-3}$ to $10^{-7}$, performance is much less certain at output BERs below $10^{-10}$. Moreover, bit-by-bit simulation of systems with an output BER below $10^{-10}$ is difficult due to the fact that the number of bits that need to be processed is too large.

Due to such difficulty, the ECC failure probability of iterative decoding algorithms are typically not known until after the integrated circuit implementing the decoding algorithm has been fabricated. Having to construct the decoding circuit before the effectiveness of the underlying decoding algorithm is known can be both time-consuming and costly.

SUMMARY OF THE INVENTION

It is therefore an object of this invention to overcome the above-mentioned problems.

It is another object of this invention to provide a design-based tool capable of estimating ECC failure probabilities in the BER range below $10^{-10}$ of iterative decoding algorithms to determine the ECC failure performance of a particular algorithm by modeling it before the circuit implementing the algorithm is fabricated.

It is a further object of this invention to provide a program of instructions embodied on a device-readable medium for implementing such a design-based tool.

According to one aspect of the invention, a method is provided for determining error correction code failure probability of an iterative decoding algorithm for a pre-selected range of signal-to-noise ratio values and a pre-selected interleaved error correction code. The method comprises the steps of: determining a signal-to-noise ratio value range where a bit error rate of the iterative decoding algorithm with respect to signal-to-noise ratio defines an error floor region; determining a probability $P_{dmin}$ of a minimal distance error event occurring in the decoding algorithm for at least one signal-to-noise ratio value within the previously-determined signal-to-noise ratio value range; determining probability $w_i$ that a minimal distance error event corrupts i bytes in the same interleave of the pre-selected error correction code; and determining the error correction code failure probability for the signal-to-noise ratio value range determined in step (a) based on the previously determined probabilities $P_{dmin}$ and $w_i$.

In addition to defining an error floor region, the bit error rate of the iterative decoding algorithm with respect to signal-to-noise ratio further defines a steep drop region and a transitional region, where the signal-to-noise ratio value range of the error floor region is greater than a signal-to-noise ratio value range of the transitional region which is greater than a signal-to-noise ratio value range of the steep drop region.

Preferably, the step of determining $P_{dmin}$ comprises determining a probability $P_{dmin}$ of a minimal distance error event occurring in the decoding algorithm for a plurality of signal-to-noise ratio values within the previously-determined signal-to-noise ratio value range. This determining step also preferably comprises determining a minimum Hamming weight of error events of the decoding algorithm $d_{min}$ and multiplying the probability $P_{dmin}$ by $d_{min}$.

Another aspect of the invention involves an apparatus for determining error correction code failure probability of an iterative decoding algorithm for a pre-selected range of signal-to-noise ratio values and a pre-selected interleaved error correction code. The apparatus comprises various circuits for implementing the functions described above. These circuits may be physically distinct integrated circuits, or they may be embodied as a single integrated circuit.

In accordance with another aspect, the invention provides a device-readable medium embodying a program of instructions for execution by a device, such as a computer processor, for performing a method of determining error correction code failure probability of an iterative decoding algorithm for a pre-selected range of signal-to-noise ratio values and a pre-selected interleaved error correction code. The program of instructions comprises instructions for carrying out the steps of the above-described method.

Other objects and attainments together with a fuller understanding of the invention will become apparent and appreciated by referring to the following description and claims taken in conjunction with the accompanying drawings.

DETAILED DESCRIPTION OF THE INVENTION

I. Concatenated Coding with Iterative Codes

Figure 1:
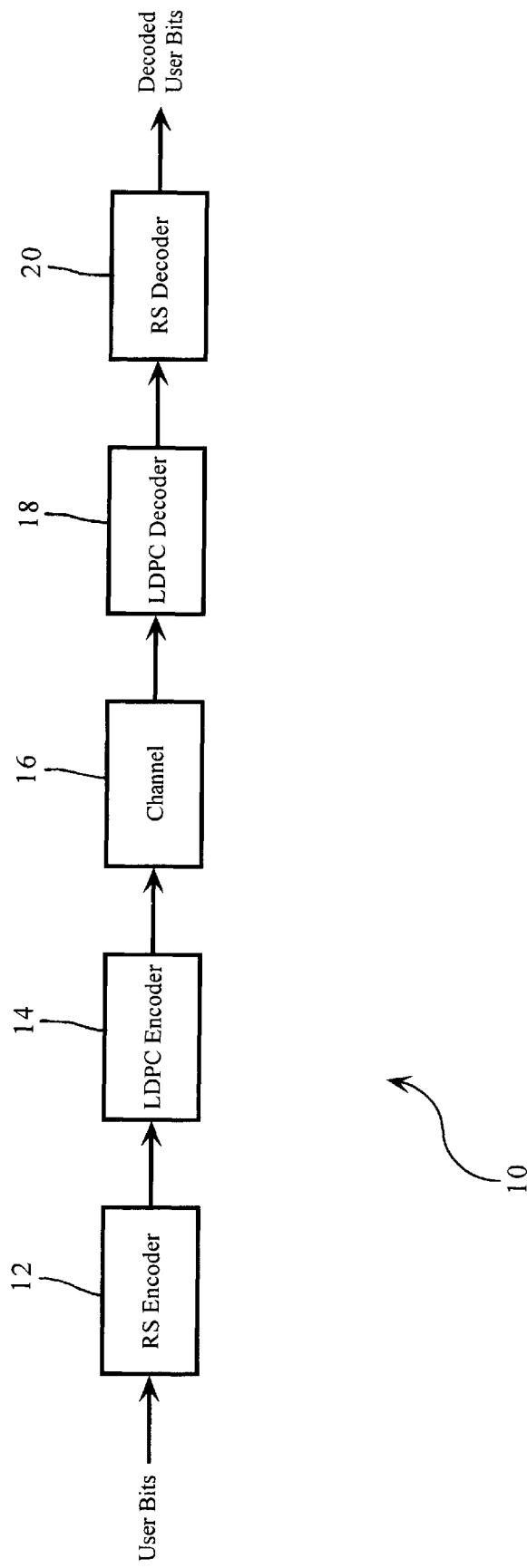
FIG. 1 is a block diagram of a communication system with both RS codes and LDPC codes.

FIG. 1 is a functional block diagram of a communication system 10, such as a hard disk system, which uses both RS codes and LDPC codes in a concatenated coding system. As is typical in current hard disk systems, data is recorded along concentric tracks on the surface of the disk. Each of these tracks is divided into a plurality of contiguous sectors, which are small sections of track with the capacity to store one block (typically 512 or 1024 bytes) of user data.

As shown in FIG. 1, user data in the form of bits is input to an RS encoder 12 which encodes each sector of data (typically 512 bytes) byte-by-byte into three RS codewords in an interleaved way. Each RS codeword can correct up to t bytes of error. The RS codewords are then input to a LDPC encoder 14 which encodes the RS coded data bit-by-bit. The output of the LDPC encoder 14 is transmitted along channel 16.

The decoding is the reverse of the encoding. That is an LDPC decoder 18 receives and decodes the data output from channel 16 to recover the RS codewords. An RS decoder 20 receives the output of the LDPC decoder and decodes the RS codewords to recover the user bits. The RS decoder 20 declares a "decoding failure" if more than t erroneous bytes appear in an RS codeword.

II. Error Characteristics of the LDPC codes

LPDC codes are linear block codes. The Bit Error Rate (BER) of LDPC codes can be expressed as:

$$BER = \sum_{i=d_{\min}}^{d_{\max}} iP_i \quad (EQ1)$$

where $d_{min}$ is the minimum Hamming weight of error events, and $d_{max}$ is the maximum Hamming weight of error events, and $P_i$ is the probability of an error event with Hamming weight i. $P_i$ decreases fast with increased channel signal-to-noise ratios (SNRs). As a result, the BER curve of iterative codes can be divided into three regions—the steep drop region, the error floor region, and the transitional region.

At low SNRs, all of the $P_i$'s are large, therefore the BER is the summation of all the terms in (EQ1), all of which drops at about the same rate with increased SNRs. At high SNRs, all the $P_i$'s are small, except for $P_{d_{min}}$, which drops slower than other terms. Therefore, the minimum distance error event is the dominant error event at high SNRs. The BER at high SNR can be approximated by:

$$BER \approx d_{\min} P_{d_{\min}} \quad (EQ2)$$

The BER curve at high SNR follows the BER curve for the dominant error event, therefore causing a "floor" in the plot. The change from the steep drop region to the error floor region is not sharp, thereby creating a transitional region in between.

III. Failure Rate Analysis

Due to the difference in error characteristics, we propose to analyze the ECC failure rate by separately analyzing the failure rate for the three regions. Consider ECC configuration having M interleaves, with t bytes correction capability per interleave.

ECC failure rate at the steep drop region and the transitional region can be obtained from the bit-by-bit simulations or by trying to model ECC failure rate using techniques discussed in the previously identified provisional application, the contents of which are incorporated herein by reference. However, it is the ECC performance at the floor region that is of most interest.

Let N be the number of LDPC words in a sector. Define $P_{dmin}$ to be the probability of a minimal distance error event occurring in a codeword. Since LDPC codewords are independent, the probability of observing k LDPC codewords in the same sector each having a minimal distance error event is $$\binom{N}{k} p_{dmin}^k (1-p_{dmin})^{N-k}, k = 0, 1, \ldots, N \quad (EQ3)$$

Each minimal distance error event can corrupt several bytes per interleave, so let $$\{w_i\}, i=0,1,\ldots,d_{min} \quad (EQ4)$$

be the probability of a minimal distance error event corrupting i bytes in the same interleave. Then, the ECC failure rate can be approximated by $$P(\text{ECC sector failure}) \approx M \quad (EQ5)$$

-continued $$\sum_{k=0}^{N} \{P(\text{interleave failures} | \text{number of code words having } d_{\min} = k) \cdot P(\text{number of code words having } d_{\min} = k)\}$$

P(number of codewords having $d_{min}=k$) is given by EQ3, and P(interleave failures|number of codewords having $d_{min}$ k) can be computed as $$\sum_{\substack{n_1,\ldots,n_{dmin}=0 \\ n_1+\ldots+n_{dmin}=k}}^{d_{\min}} I_{\{n_1+2n_2\ldots+d_{\min}n_{dmin}>t\}} \frac{d_{\min}!}{n_1!\ldots n_{dmin}!} w_1^{n_1} \cdot \ldots \cdot w_{d_{\min}}^{n_{dmin}} \quad \text{(EQ6)}$$

where, $I_{\{\ldots\}}$ is the indicator function.

Figure 2:
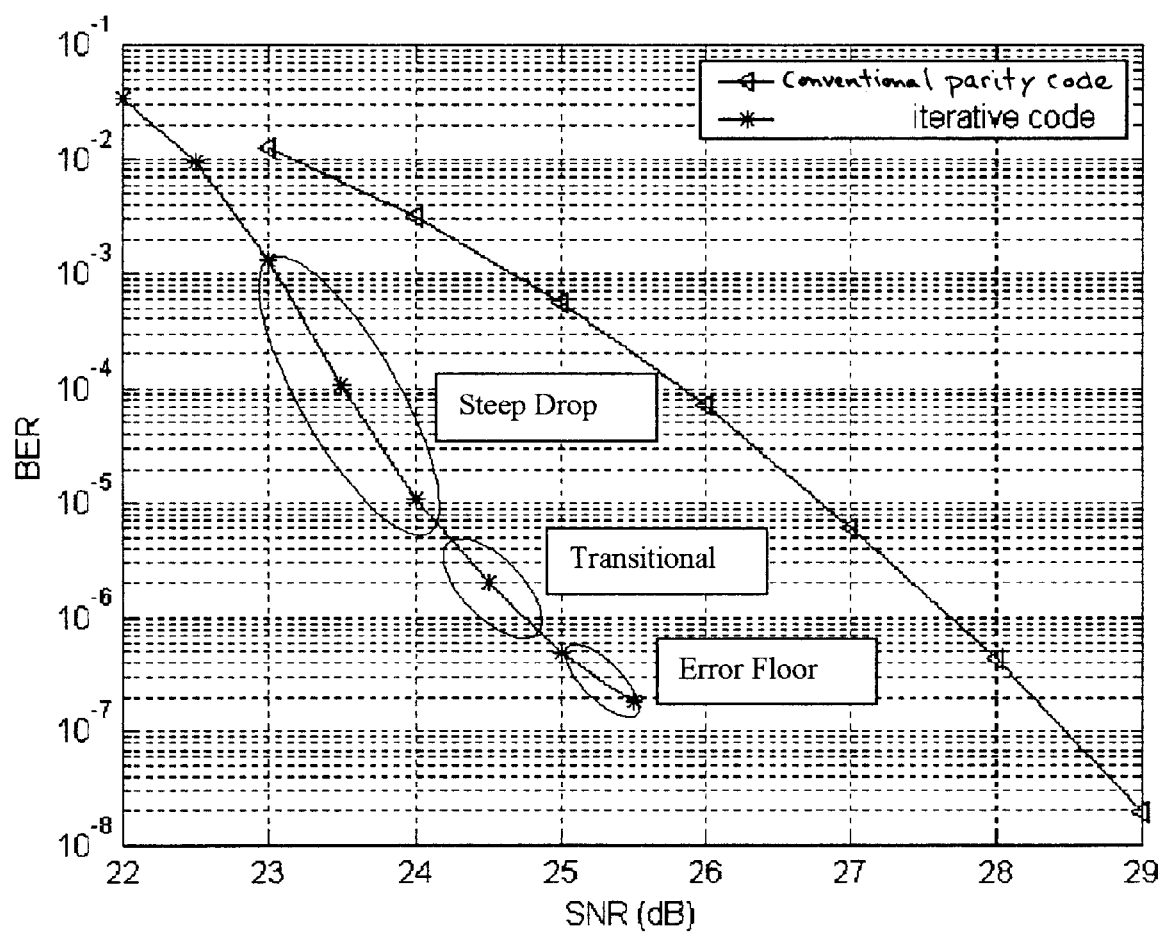
FIG. 2 is a bit error curve showing the bit error rate (BER) vs. the signal-to-noise ratio (SNR) for LDPC codes.
Figure 3:
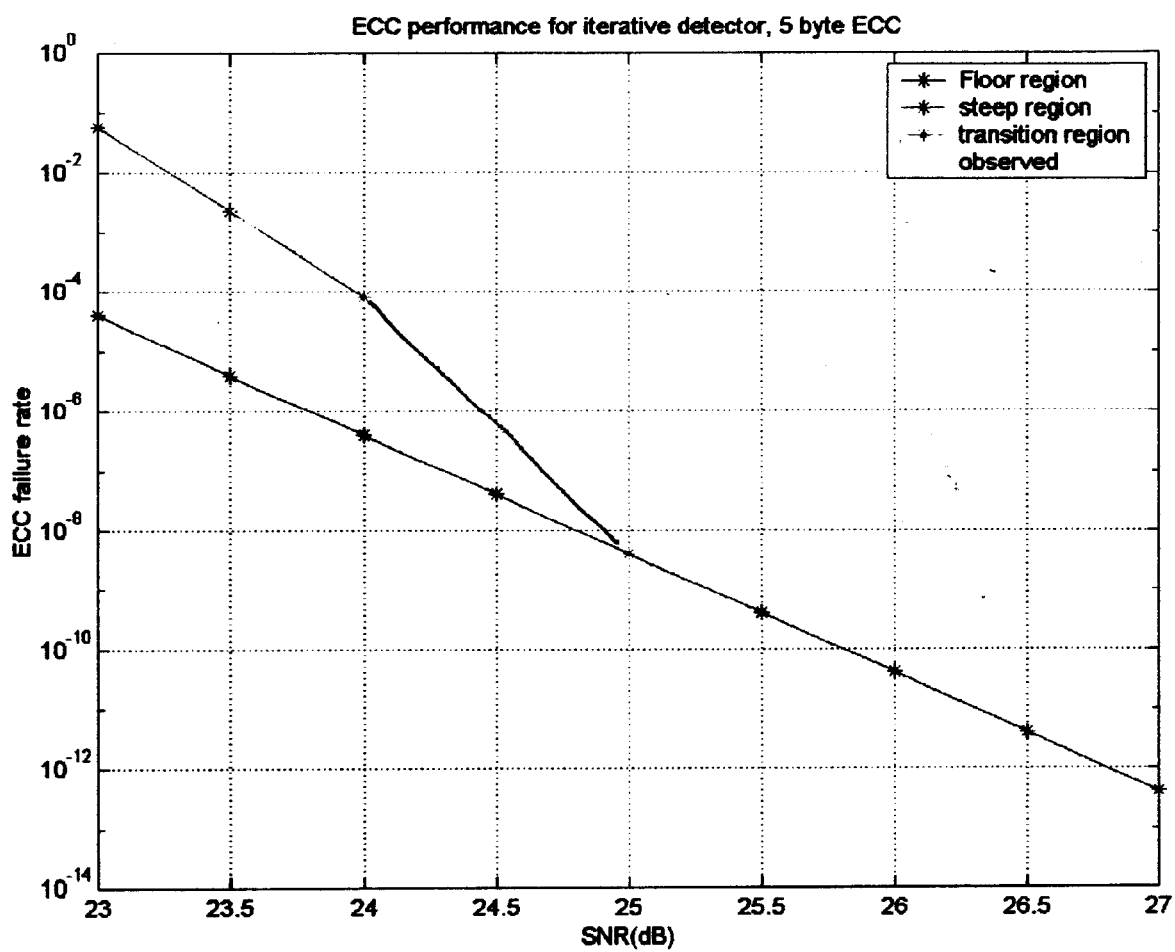
FIG. 3 illustrates the ECC failure rate as a function of SNR for the three different regions identified in FIG. 2.
Figure 4:
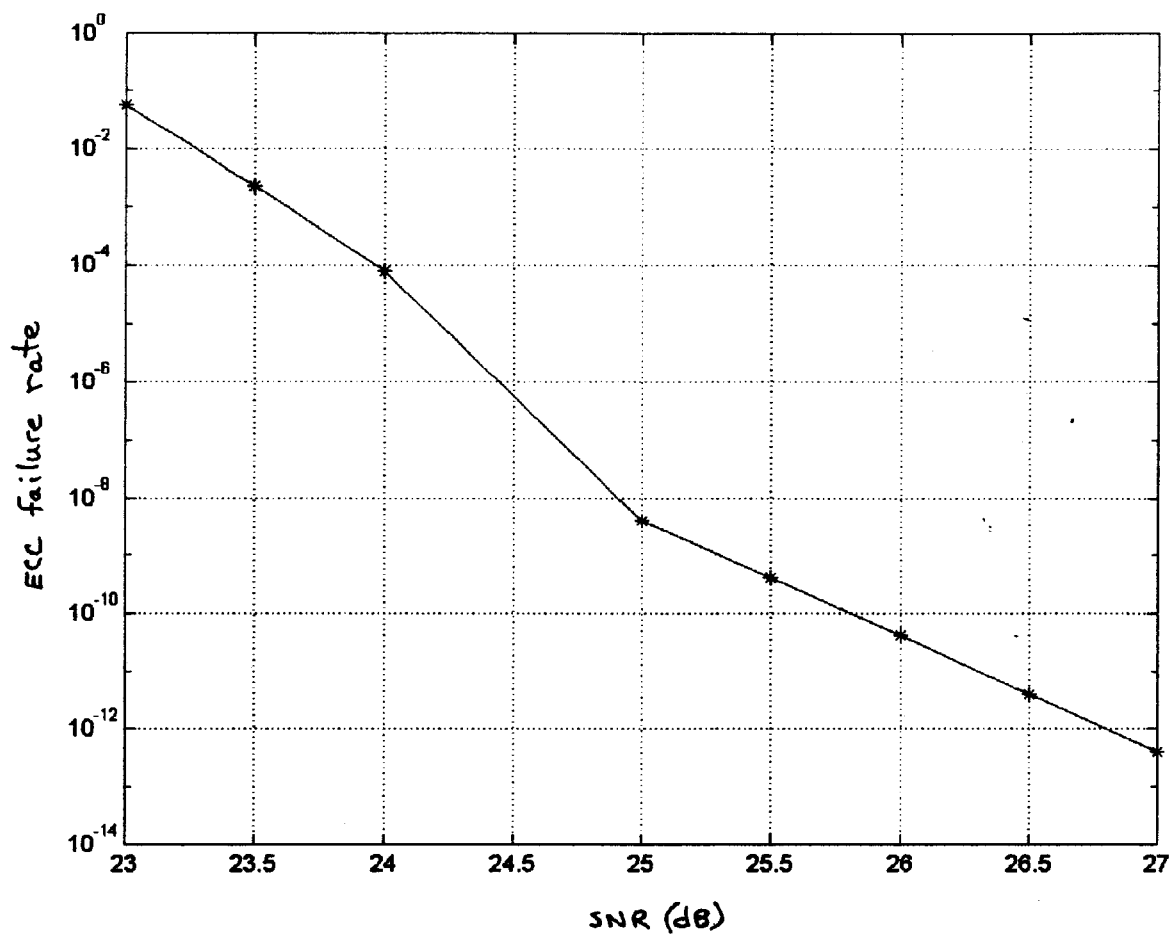
FIG. 4 illustrates the overall ECC failure rate as a function of SNR of all of the curves plotted in FIG. 3.

As an example, we apply the aforementioned procedure to Marvell's LDPC code (iterative code). Its BER is plotted in FIG. 2. The ECC failure rate for the three different regions is plotted in FIG. 3. For the error floor region, the ECC failure rate are obtained by observing the BER at SNR=24.5 and 25 dB, calculating the Pdin at SNR=24.5 and 25 dB, and below this range it is assumed that $P_{d_{min}}$ drops at a constant rate with respect to SNR. The ECC failure rate due to the minimum distance error event is also extended to the low SNR region, and it is clear that such error events do not dominate the ECC performance at low SNRs. The overall ECC failure rate, which is the sum of all of the curves in FIG. 3, is plotted in FIG. 4.

Figure 5:
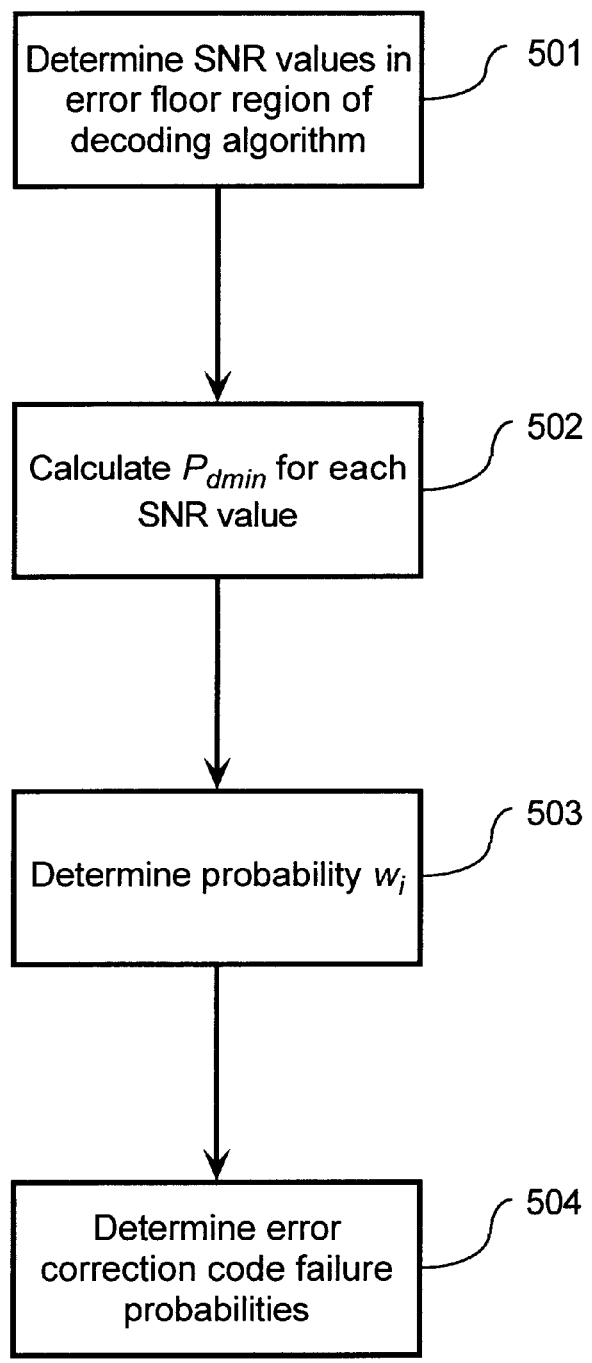
FIG. 5 is a flow chart illustrating a method of determining an error correction code failure probability of an iterative decoding algorithm in accordance with aspects of the invention.

Referring now to FIG. 5, a flow chart illustrates the general steps of a method for determining ECC failure probability of an iterative decoding algorithm for a particular interleaved ECC, in accordance with aspects of the present invention. The method begins at step 501 where a plurality of SNR values in the error floor region of the decoding algorithm are determined. For each of these SNR values, $P_{d_{min}}$ is calculated in step 502. Probabilities $w_i$ that a minimal distance error event corrupts i bytes in the same interleave of the error correction code are also determined in step 503. The error correction code failure probabilities for each of the SNR values determined in step 501 are then calculated based on the probabilities determined in steps 502 and 503, as previously described.

IV. System Implementation

The functions required to carry out the method of the present invention can be implemented in a variety of ways including with software running on a computer system, or with appropriately configured hardware.

Figure 6:
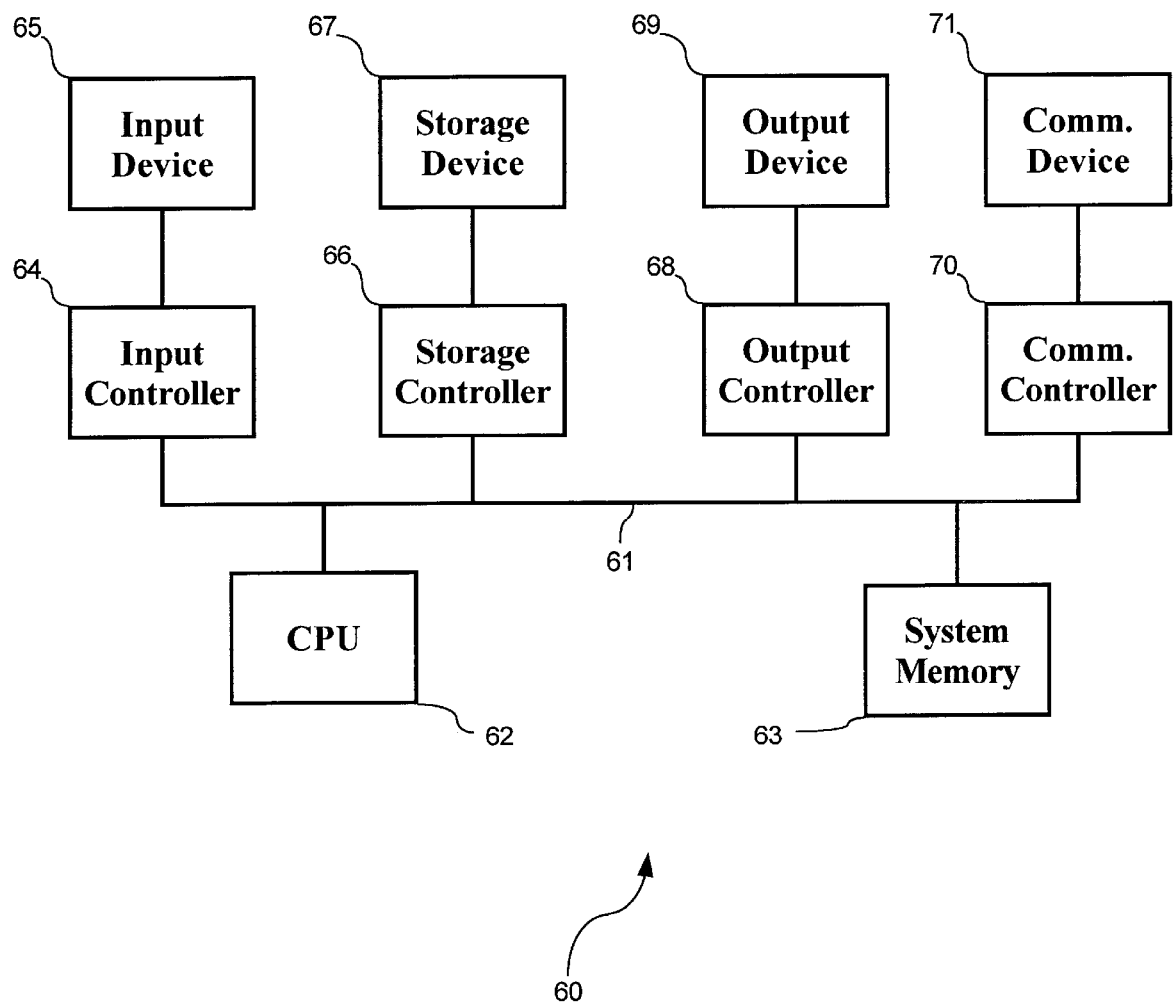
FIG. 6 is a schematic diagram of a typical computer system which may be used to implement various aspects of the invention.

FIG. 6 shows the general configuration of typical computer system 60 which may be used to implement the above-described method, according to aspects of the present invention. Central processing unit (CPU) 62 provides computing resources and controls the computer. CPU 62 may be implemented with a microprocessor or the like, and may also include a floating point coprocessor for mathematical computations. Computer 60 further includes system memory 63 which may be in the form of random-access memory (RAM) and read-only memory (ROM).

In the illustrated embodiment, a number of controllers and peripheral devices are also provided. Input controller 64 is an interface to one or more input devices 65, such as a keyboard, mouse or stylus, to enable a user to input data/ instructions to the computer. Storage controller 66 is an interface to a storage device 67 that includes a storage medium such as magnetic tape or disk, or an optical medium that may be used to record programs of instructions for operating systems, utilities and applications which may include embodiments of programs that implement various aspects of the present invention. Output controller 68 provides an interface to output device 69 which may be any suitable display device, printer, or the like. Communications controller 70 interfaces with communication device 71 which may be a modem or other network connection. Programs that implement various aspects of this invention may be transmitted to computer system 60 from a remote location (e.g., a server or another computer) over a network.

In the embodiment shown, all major system components connect to bus 61 which may represent more than one physical bus. For example, some personal computers incorporate only a so called Industry Standard Architecture (ISA) bus. Other computers incorporate an ISA bus as well as a higher bandwidth bus. A bus architecture is not required to practice the present invention.

Software for performing the functions required to practice various aspects of the present invention can be loaded into computer 60 from storage device 67 and executed by CPU 62. More broadly, such software may be conveyed by a variety device-readable medium including magnetic tape or disk, optical disc, infrared signals, and baseband or modulated communication paths throughout the electromagnetic spectrum including from supersonic to ultraviolet frequencies.

Figure 7:
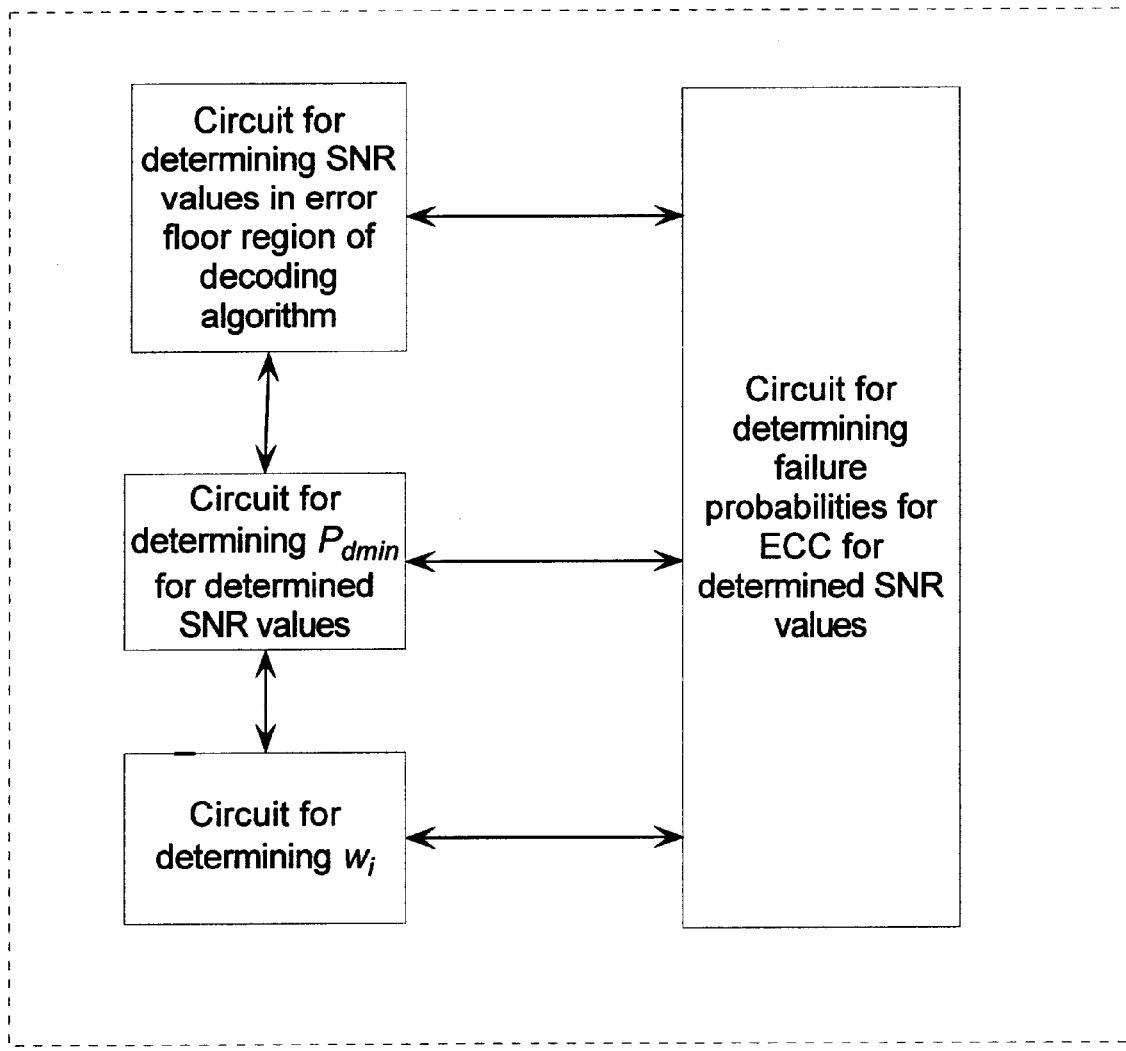
FIG. 7 is a schematic diagram of various components that may be used to implement various aspects of the invention.

As an alternative to software implementation, the method of the present invention may also be implemented using discrete logic circuits, one or more application specific integrated circuits (ASICs), digital signal processors, program-controlled processors, or the like. FIG. 7 is a functional block diagram illustrating the interrelationship of circuits that may be used to perform various functions of the present invention. For example, circuits 72, 74, 76 and 78 may be constructed based on 5 the teachings herein to implement the functions specified in FIG. 5. These circuits may be physically distinct integrated circuits or may be embodied as a single integrated circuit.

It should be readily apparent from the foregoing description that the present invention provides a design-based tool to determine the ECC failure rate of a particular digital iterative decoding algorithm by modeling it before an integrated circuit implementing the decoding algorithm is manufactured. Thus, the tool, which can be implemented with software, hardware or combination thereof, serves as a design tool for such decoders.

While the invention has been described in conjunction with specific embodiments, many further alternatives, modifications, variations and applications will be apparent to those skilled in the art in light of the foregoing description. Thus, the invention described herein is intended to embrace all such alternatives, modifications, variations and applications as may fall within the spirit and scope of the appended claims.

What is claimed is:

1. A method for determining error correction code failure probability of an iterative decoding algorithm for a preselected range of signal-to-noise ratio values and a preselected interleaved error correction code, comprising the steps of:

(a) determining a signal-to-noise ratio value range where a bit error rate of the iterative decoding algorithm with respect to signal-to-noise ratio defines an error floor region;

(b) determining a probability $P_{dmin}$ of a minimal distance error event occurring in the decoding algorithm for at least one signal-to-noise ratio value within the signal-to-noise ratio value range determined in step (a);

(c) determining probability $w_i$ that a minimal distance error event corrupts i bytes in the same interleave of the pre-selected error correction code; and (d) determining the error correction code failure probability for the signal-to-noise ratio value range determined in step (a) based on the probabilities determined in steps (b) and (c).

2. The method of claim 1, wherein the bit error rate of the iterative decoding algorithm with respect to signal-to-noise ratio further defines a steep drop region and a transitional region, and wherein the signal-to-noise ratio value range of the error floor region is greater than a signal-to-noise ratio value range of the transitional region which is greater than a signal-to-noise ratio value range of the steep drop region.

3. The method of claim 1, wherein determining step (b) comprises determining a probability $P_{dmin}$ of a minimal distance error event occurring in the decoding-algorithm for a plurality of signal-to-noise ratio values within the signal-to-noise ratio value range determined in step (a).

4. The method of claim 1, wherein determining step (b) comprises determining a minimum Hamming weight of error events of the decoding algorithm $d_{min}$ and multiplying the probability $P_{dmin}$ by $d_{min}$.

5. An apparatus for determining error correction code failure probability of an iterative decoding algorithm for a pre-selected range of signal-to-noise ratio values and a pre-selected interleaved error correction code, the apparatus comprising:

(a) a first circuit that determines a signal-to-noise ratio value range where a bit error rate of the iterative decoding algorithm with respect to signal-to-noise ratio defines an error floor region;

(b) a second circuit in communication with the first circuit that determines a probability $P_{dmin}$ of a minimal distance error event occurring in the decoding algorithm for at least one signal-to-noise ratio value within the signal-to-noise ratio value range determined by the first circuit;

(c) a third circuit in communication with the second circuit that determines probability $w_i$ that a minimal distance error event corrupts i bytes in the same interleave of the pre-selected error correction code; and (d) a fourth circuit in communication with the first, second and third circuits that determines the error correction code failure probability for the signal-to-noise ratio value range determined in by the first circuit based on the probabilities determined by the second and third circuits.

6. The apparatus of claim 5, wherein the first, second, third and fourth circuits are physically distinct integrated circuits.

7. The apparatus of claim 5, wherein the first, second, third and fourth circuits are embodied as a single integrated circuit.

8. The apparatus of claim 5, wherein the bit error rate of the iterative decoding algorithm with respect to signal-to-noise ratio further defines a steep drop region and a transitional region, and wherein the signal-to-noise ratio value range of the error floor region is greater than a signal-to-noise ratio value range of the transitional region which is greater than a signal-to-noise ratio value range of the steep drop region.

9. The apparatus of claim 5, wherein the second circuit determines a probability $P_{din}$, of a minimal distance error event occurring in the decoding algorithm for a plurality of signal-to-noise ratio values within the signal-to-noise ratio value range determined by the first circuit.

10. The apparatus of claim 5, wherein the second circuit comprises circuitry that determines a minimum Hamming weight of error events of the decoding algorithm $d_{min}$ and multiplies the probability $P_{dmin}$ by $d_{min}$.

11. An apparatus for determining error correction code failure probability of an iterative decoding algorithm for a pre-selected range of signal-to-noise ratio values and a pre-selected interleaved error correction code, the apparatus comprising:

(a) first means for determining a signal-to-noise ratio value range where a bit error rate of the iterative decoding algorithm with respect to signal-to-noise ratio defines an error floor region;

(b) second means for determining a probability $P_{dmin}$ of a minimal distance error event occurring in the decoding algorithm for at least one signal-to-noise ratio value within the signal-to-noise ratio value range determined by the first means;

(c) third means for determining probability $w_i$ that a minimal distance error event corrupts i bytes in the same interleave of the pre-selected error correction code; and (d) fourth means for determining the error correction code failure probability for the signal-to-noise ratio value range determined by the first means based on the probabilities determined by the second and third means.

12. The apparatus of claim 11, wherein the first, second, third and fourth means are physically distinct from one another.

13. The apparatus of claim 11, wherein the first, second, third and fourth means are embodied as a single integrated unit.

14. The apparatus of claim 11, wherein the bit error rate of the iterative decoding algorithm with respect to signal-to-noise ratio further defines a steep drop region and a transitional region, and wherein the signal-to-noise ratio value range of the error floor region is greater than a signal-to-noise ratio value range of the transitional region which is greater than a signal-to-noise ratio value range of the steep drop region.

15. The apparatus of claim 11, wherein the second means determines a probability $P_{dmin}$ of a minimal distance error event occurring in the decoding algorithm for a plurality of signal-to-noise ratio values within the signal-to-noise ratio value range determined by the first circuit.

16. The apparatus of claim 11, wherein the second means determines a minimum Hamming weight of error events of the decoding algorithm $d_{min}$ and multiplies the probability $P_{dmin}$ by $d_{min}$.

17. A device-readable medium embodying a program of instructions for execution by a device for performing a method of determining error correction code failure probability of an iterative decoding algorithm for a pre-selected range of signal-to-noise ratio values and a pre-selected interleaved error correction code, the program of instructions comprising:

(a) first instructions for determining a signal-to-noise ratio value range where a bit error rate of the iterative decoding algorithm with respect to signal-to-noise ratio defines an error floor region;

(b) second instructions for determining a probability $P_{dmin}$ of a minimal distance error event occurring in the decoding algorithm for at least one signal-to-noise ratio value within the signal-to-noise ratio value range determined by the first instructions;

(c) third instructions for determining probability $w_i$ that a minimal distance error event corrupts i bytes in the same interleave of the pre-selected error correction code; and (d) fourth instructions for determining the error correction code failure probability for the signal-to-noise ratio value range determined by the first instructions based on the probabilities determined by the second and third instructions.

18. The device-readable medium of claim 17, wherein the bit error rate of the iterative decoding algorithm with respect to signal-to-noise ratio further defines a steep drop region and a transitional region, and wherein the signal-to-noise ratio value range of the error floor region is greater than a signal-to-noise ratio value range of the transitional region which is greater than a signal-to-noise ratio value range of the steep drop region.

19. The device-readable medium of claim 17, wherein the second instructions comprises instructions for determining a probability $P_{dmin}$ of a minimal distance error event occurring in the decoding algorithm for a plurality of signal-to-noise ratio values within the signal-to-noise ratio value range determined by the first instructions.

20. The device-readable medium of claim 17, wherein the second instructions comprises instructions for determining a minimum Hamming weight of error events of the decoding algorithm $d_{min}$ and multiplying the probability $P_{dmin}$ by $d_{min}$.

* * * * *